June 7, 1960 M. DRUBIN 2,939,968

TRANSISTOR EMITTER FOLLOWER CIRCUIT

Filed Aug. 13, 1957

INVENTOR.
MEIR DRUBIN
BY H. L. Mackey
ATTORNEY.

United States Patent Office 2,939,968

Patented June 7, 1960

2,939,968

TRANSISTOR EMITTER FOLLOWER CIRCUIT

Meir Drubin, Tarrytown, N.Y., assignor to General Precision, Inc., a corporation of Delaware Filed Aug. 13, 1957, Ser. No. 677,897

5 Claims. (Cl. 307—88.5)

This invention relates to transistor amplifier circuits having a common collector terminal, and more especially to such circuits having good high frequency characteristics.

Such circuits, termed transistor emitter followers, ordinarily have very poor high frequency characteristics. For example, a transistor having the ability to transmit 30 megacycles per second in a grounded-base amplifier circuit may transmit frequencies no higher than 0.3 megacycle per second in a grounded-collector amplifier circuit. The reason for this behavior is related to the emitter capacitance. This capacitance appears in the equivalent circuit as a large capacitance connected between base and emitter, and in the usual emitter follower circuits this capacitance acts as a shunt path between input and output of the amplifier. This capacitance not only sets a reduced frequency limit to the effectiveness of the amplifier but also is responsible for a badly drooping frequency characteristic within the transmission band and for high input current requirements. As one result of these characteristics the waveform is severely degraded when the amplifier is used with pulse signals, so that these amplifiers are generally not considered suitable for such use.

The present invention provides an improvement in the transistor emitter follower circuit which effectively converts the capacitive reactance effect of the emitter capacitance to an inductive reactance effect. That is, the emitter-base capacitance is combined in a circuit for presentation to the input signal as if it were inductance, not capacitance. The upper limit of frequency response is thereby greatly increased and within the transmission band the frequency response is made uniform. The input power requirements are also greatly reduced.

These results are effected by the addition of an electromagnetic voltage step-up transformer which feeds the output signal back in a positive or regenerative sense to the input. A diode is inserted in the feedback circuit to prevent self-oscillation. A second diode is inserted in the input circuit.

One purpose of this invention is to provide a transistor emitter follower circuit having improved high frequency operation.

Another purpose of this invention is to provide a transistor emitter follower circuit suitable for pulse operation.

A further understanding of this invention may be secured from the detailed description and drawings, in which.

Figure 1:
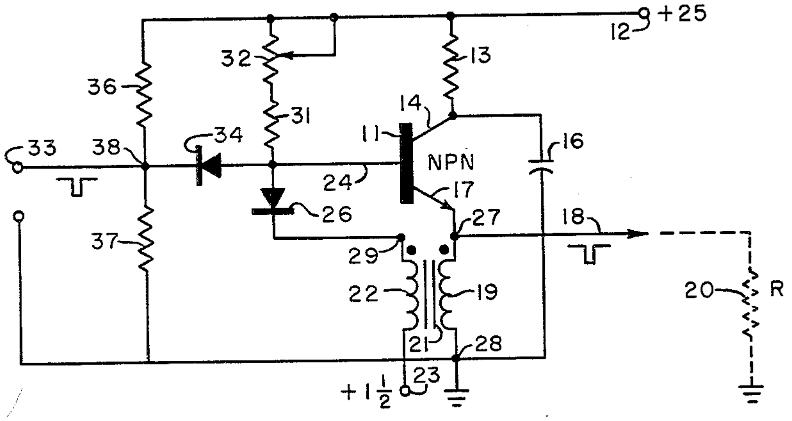
Figure 1 is a schematic wiring diagram of an embodiment of the invention employing an NPN transistor.

Referring now to Fig. 1, an NPN transistor 11 is connected in a common or grounded collector circuit of the kind termed an emitter follower circuit. Positive potential is applied from terminal 12 through a resistor 13 to the transistor collector terminal 14, and a large capacitor 16 connected between terminal 14 and ground places the collector at ground potential for varying signals. The emitter terminal 17 is connected to the load 20 having a resistance R through conductor 18, and is also connected to one terminal 27 of the primary winding 19 of transformer 21, the other terminal 28 of this winding being grounded. The other winding 22 of transformer 21 is connected between a source of positive potential 23 and the transistor base terminal 24, a diode 26 being inserted in series between the winding and the base terminal 24 with its positive terminal connected to the base.

The function of transformer 21 is to step up the transistor output voltage and to feed it back in a regenerative sense from the emitter to the base. It is therefore necessary to pole the transformer windings so that when terminal 27 of primary winding 19 is negative relative to the other terminal 28, the induced potential at terminal 29 of winding 22 will also be negative relative to terminal 23. This polarization is indicated by the dots adjacent terminals 27 and 29. Transformer 21 must be capable of transmitting all frequencies contained in signals applied to this circuit. For example, if the signal consists of pulses having 0.1 $\mu$s. edges, the transformer should be able to transmit 10 mcps in order to avoid undue deterioration of pulse form. The ratio of turns in winding 22 to those in winding 19 should be as high as possible when the circuit input impedance $Z_1$ is desired to be high, but a limit is set by the tendency of large windings to parasitic resonances due to winding capacitance. In this example the ratio is 2:1. The primary inductance should be as high as possible in order to secure high input impedance because this winding is in shunt with the load.

It has been found that the input impedance of this circuit during the signal may be approximately expressed by:

$$Z_1 \approx 2\omega n^2 L_p$$

in which $\omega$ symbolizes any of the Fourier input frequency components representing the 0.1 $\mu$sec. pulse edge, $n$ is the turns ratio between windings 22 and 19, and $L_p$ is the unloaded inductance of the primary winding 19. This equation thus formulates the statements just made.

The base electrode 24 is given a positive direct current bias by connecting it through resistor 31 and rheostat 32 to positive source 12. Input signals are applied from terminal 33 to the negative terminal of a diode 34 having its positive terminal connected to the base electrode 24. This circuit is designed for negative pulse input signals, and diode 34 is poled so as to exclude positive signals or the positive parts of alternating signals, and so as to cut off any positive spikes which negative pulses may have. The use of this diode also isolates and defines the base direct current bias voltage. Diode 34 is so biased by application of positive potential to its input side as to be non-conductive in the absence of negative input pulse signals. This bias may be applied, for example, by connecting a voltage divider comprising resistors 36 and 37 between positive potential and ground, with the common junction 38 connected to the diode 34 negative terminal. However, this method of applying bias is merely illustrative, and in use the supplying of diode bias may be a function of the signal source connected to input terminal 33.

The magnitudes of resistors 13 and 31 and rheostat 32 are determined in the usual manner with the aid of the collector voltage-current family of characteristic curves on which a load line is drawn. As a specific illustration when one type of transistor is employed, the collector resistor 13 being 1000 ohms, and the base bias resistors totaling about 35,000 ohms, the no-signal collector current is 10 ma., the collector potential is +15 volts, the base current is 0.7 ma., and the base potential bias is +0.5 volt. Under these conditions it is found that a bias of plus 1½ volts must be applied to the transformer terminal 23 and a bias of plus one volt must be applied by voltage dividers 36/37 to the negative or left side of diode 34.

In the operation of this circuit, in the absence of any input signal diode 34 is non-conductive since the positive potential on its negative terminal exceeds by 0.5 volt the positive potential on its positive terminal. Diode 26 is also non-conductive since the positive potential differential on its negative terminal is 1.0 volt.

The input signal may be a negative pulse or negative pulse train of any magnitude great enough to open the diodes. With the values given this magnitude is any negative voltage greater than one-half volt plus the overvoltage necessary to bring the diode to its conducting threshold. Let it be supposed, for example, that a single rectangular negative pulse having a peak voltage of 2.5 volts below the bias level of junction 38 and a duration of two-tenths microsecond be applied between the input terminal 33 and ground. In place of a single pulse, a pulse train could as well be assumed. This negative 2.5-volt pulse overcomes the bias on diode 34, which becomes conductive. The 2.5-volt pulse minus 1 volt drop across diode 34 is thus applied to the base 24 and causes an output negative pulse from emitter 17 of slightly less than 1.5 volts but having its power augmented three or more times. This constitutes the output pulse at conductor 18 for application to the load. The output pulse also energizes the transformer primary winding 19 which is in shunt with the load. The transformer, having a 2:1 voltage step-up ratio, applies −3 volts from its secondary winding 22 terminal 29 to the diode 26. This overcomes the net +1 volt bias thereon, so that this diode becomes conductive and the −3 volt pulse is applied to the base 24, constituting regenerative feedback. Although the feedback is regenerative, free oscillation cannot occur because diode 26 would prevent the positive half cycles of the oscillatory feedback voltage from reaching the base.

The novel action of the circuit resides principally in the frequency and impedance characteristics presented to the input signal. These characteristics can be accurately derived and described only through transient analysis and its mathematical results. Without detailing such analysis, it may be said that the input impedance of the circuit of this invention is proportional to the Fourier input frequency components representing the 0.1 $\mu$sec. pulse edge, to the transformer primary inductance, and to the square of the transformer turns ratio. Furthermore, the input impedance is nearly independent of the load resistance during the existence of the input signal with diode 34 in the conductive state. As regards the input frequency characteristic, transient analysis indicates that the frequency limit which will be transmitted by the transistor in this circuit is considerably extended. Limits are set, however, as in any circuit, by distributed wiring and winding capacitances, which in the instant invention consist principally of the distributed capacitance of the windings of the feedback transformer 21. Since this distributed capacitance may be made very low, the instant circuit may be made to transmit frequencies many times higher than those which the conventional emitter follower circuit can transmit. Additionally, the input impedance is easily made many times greater than the input impedance of the conventional emitter follower, with input current correspondingly less.

Figure 2:
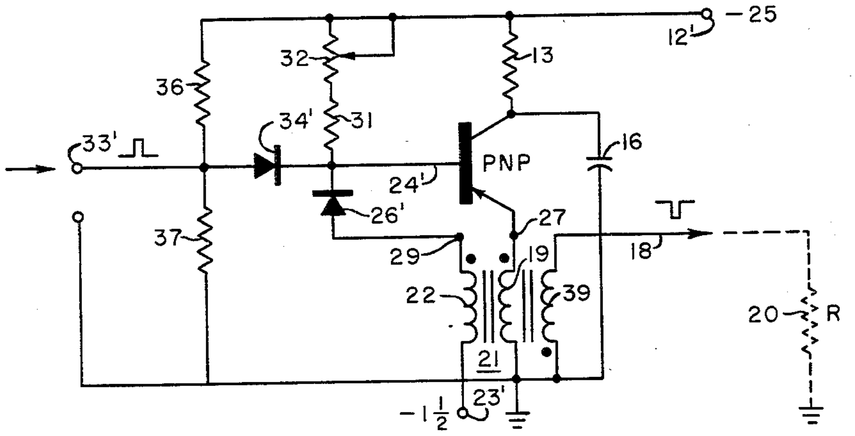
Figure 2 is a schematic wiring diagram of a second embodiment of the invention employing a PNP transistor.

The circuit of Fig. 2 employing a PNP transistor corresponds in nearly every respect to the NPN circuit of Fig. 1 with power and bias supply polarities reversed and other required polarity changes made. All resistors and capacitors are identical and identically numbered. The primary winding 19 and secondary winding 22 of transformer 21 are identical to those of Fig. 1 and their terminals 27 and 29 are identically poled. However, the output conductor 18 is connected to a tertiary winding 39 having a 1:1 turn ratio to the primary winding 19. This permits direct current isolation of the output and selection of the sense of the output pulse.

The PNP transistor embodiment of Fig. 2 employs a negative 25 volt collector and base bias voltage source 12'. The 1½ volt supply to terminal 23' is negative. Diode 26' is reversed with its negative terminal connected to base 24', as is diode 34'. This circuit is thus arranged for application of positive pulse input signals to the input terminal 33'.

What is claimed is:

1. A transistor emitter follower circuit for negative pulse signals comprising an NPN transistor having collector, emitter and base, a pulse signal input circuit connected between said collector and base, a pulse signal output circuit connected between said collector and emitter, a source of potential having positive and negative terminals, a resistor connecting said positive terminal to said collector, a capacitor bypassing said resistor, a resistor connecting said positive terminal to said base, a voltage step-up transformer having primary and secondary windings, said primary winding being connected between said emitter and said negative terminal, said secondary winding being connected between a positive potential source and the negative terminal of a diode rectifier and the positive terminal of said diode rectifier being connected to said base, a diode rectifier connected in said input circuit having its positive terminal connected to said base, and positive direct current means biasing said second mentioned diode rectifier.

2. A transistor emitter follower circuit for positive pulse signals comprising a PNP transistor having collector, emitter and base, a pulse signal input circuit connected between said collector and base, a pulse signal output circuit connected between said collector and emitter, a source of potential having positive and negative terminals, a resistor connecting said negative terminal to said collector, a capacitor bypassing said resistor, a resistor connecting said negative terminal to said base, a voltage step-up transformer having primary and secondary windings, said primary winding being connected between said emitter and said positive terminal, said secondary winding being connected between a negative potential source and the positive terminal of a diode rectifier and the negative terminal of said diode rectifier being connected to said base, a diode rectifier connected in said input circuit having its negative terminal connected to said base, and negative direct current means biasing said second mentioned diode rectifier.

3. A transistor emitter follower circuit for pulse signals of a selected polarity comprising, a transistor having collector, emitter and base, a pulse signal input circuit connected between said collector and base, a pulse signal output circuit connected between said collector and emitter, a source of constant potential having first and second terminals of opposite polarities, a resistor connecting said first terminal to said collector, the polarity of said first terminal being such as to tend to cause backward current to pass through the collector element of said transistor, said first terminal polarity being opposite to said pulse signal selected polarity, a capacitor bypassing said resistor, a resistor connecting said first terminal to said base, a voltage step-up transformer having primary and secondary windings, said primary winding being connected between said emitter and said second terminal, said secondary winding being connected between a first terminal of a low voltage source and the first terminal of a first diode rectifier, the second terminal of said low voltage source being connected to said second terminal of the source of constant potential and having the same polarity, the second terminal of said first diode rectifier being connected to said base, the polarity of the first terminal thereof being the same as the polarity of the first terminal of said source of constant potential, a second diode rectifier connected in series in said input circuit having one terminal connected to said base of like polarity to said first terminal of the source of constant potential, and means back-biasing said second diode rectifier.

4. A transistor emitter follower circuit comprising, a transistor including collector, base and emitter electrodes, a reference bus, a by-pass capacitor connected between said collector and said reference bus, a potential bus, a first source of constant potential having a first terminal of polarity tending to cause collector terminal backward current connected to said potential bus, said first source having a second terminal of opposite polarity connected to said reference bus, a resistor connected between said potential bus and said collector, a resistor connected between said potential bus and said base, a transformer having primary and secondary windings, said primary winding being connected between said emitter and said ground reference bus, a second source of constant potential having first and second terminals of polarities like said first source of constant potential first and second terminals respectively, said two second terminals being connected, said secondary winding being connected between said first terminal of the second source of constant potential and the terminal of like polarity of a diode rectifier, the other terminal thereof being connected to said base, a second diode rectifier having one terminal connected to the other terminal of said first diode and of the same polarity, means back-biasing said second diode rectifier, an input pulse circuit connected between the other terminal of said second diode and said reference bus, and an output pulse circuit connected between said emitter and said reference bus.

5. A transistor emitter follower circuit comprising, a transistor including collector, base and emitter electrodes, a by-passed resistor having one terminal connected to said collector electrode, means applying direct current of selected polarity to the other terminal of said resistor whereby backward bias is applied to said collector electrode, resistor means applying direct current forward bias to said base electrode, a pulse signal input circuit connected between said collector and base electrodes, a diode rectifier connected in series in said signal input circuit having the electrode of polarity opposite to said selected polarity connected to said base, a pulse signal output circuit coupled between said emitter and collector electrodes, a step-up transformer having primary and secondary windings, said primary winding being capacitor-coupled between said emitter and collector electrodes, and a diode rectifier having one electrode of polarity opposite to said selected polarity connected to said base electrode and having the other electrode connected to one terminal of said secondary winding the other terminal thereof being connected to a potential source of said selected polarity.

References Cited in the file of this patent

UNITED STATES PATENTS

| | | |
|---|---|---|
| 2,745,012 | Felker | May 8, 1956 |
| 2,758,208 | Grayson | Aug. 7, 1956 |
| 2,774,888 | Trousdale | Dec. 18, 1956 |
| 2,777,092 | Mandelkorn | Jan. 8, 1957 |
| 2,802,118 | Simkins | Aug. 6, 1957 |
| 2,810,080 | Trousdale | Oct. 15, 1957 |
| 2,816,230 | Lindsay | Dec. 10, 1957 |
| 2,837,651 | Schultz | June 3, 1958 |
| 2,849,615 | Gustafason | Aug. 26, 1958 |
| 2,854,615 | Light | Sept. 30, 1958 |
| 2,873,388 | Trumbo | Feb. 10, 1959 |
| 2,887,590 | Warman | May 10, 1959 |